(12) United States Patent
Mori

(10) Patent No.: US 9,896,047 B2
(45) Date of Patent: Feb. 20, 2018

(54) POWER SUPPLY APPARATUS AND VEHICLE INCLUDING THE SAME

(71) Applicant: TOYOTA JIDOSHA KABUSHIKI KAISHA, Toyota-shi, Aichi-ken (JP)

(72) Inventor: Kazuya Mori, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 157 days.

(21) Appl. No.: 15/019,436

(22) Filed: Feb. 9, 2016

(65) Prior Publication Data

US 2016/0236633 A1 Aug. 18, 2016

(30) Foreign Application Priority Data

Feb. 17, 2015 (JP) ................. 2015-028541

(51) Int. Cl.
| | | |
|---|---|---|
| B60L 1/00 | (2006.01) | |
| B60L 3/00 | (2006.01) | |
| H02G 3/00 | (2006.01) | |
| B60R 16/03 | (2006.01) | |
| H02J 1/00 | (2006.01) | |
| G01R 31/327 | (2006.01) | |
| H01H 47/00 | (2006.01) | |
| G01R 31/40 | (2014.01) | |
| G01R 31/00 | (2006.01) | |
| G01R 31/02 | (2006.01) | |

(52) U.S. Cl.
CPC ............ B60R 16/03 (2013.01); B60L 1/006 (2013.01); B60L 3/0069 (2013.01); G01R 31/3278 (2013.01); G01R 31/40 (2013.01); H01H 47/002 (2013.01); H02J 1/00 (2013.01); G01R 31/006 (2013.01); G01R 31/025 (2013.01)

(58) Field of Classification Search
CPC ................................ B60R 16/03; B60L 1/006
USPC .......................................................... 307/9.1
See application file for complete search history.

(56) References Cited

U.S. PATENT DOCUMENTS

| | | | |
|---|---|---|---|
| 2014/0002024 A1* | 1/2014 | Ang | ...... H02J 7/0036 |
| | | | 320/109 |
| 2014/0180517 A1 | 6/2014 | Endo | |
| 2015/0241500 A1 | 8/2015 | Mochizuki et al. | |

FOREIGN PATENT DOCUMENTS

| | | | | |
|---|---|---|---|---|
| JP | 2011205755 A | * | 10/2011 | ........... B60L 3/0069 |
| JP | 2012253993 A | | 12/2012 | |
| JP | 2013070474 A | | 4/2013 | |
| JP | 2014087154 A | | 5/2014 | |
| JP | 2014204455 A | | 10/2014 | |
| WO | 2014/041796 A1 | | 3/2014 | |

* cited by examiner

Primary Examiner — Lincoln Donovan
Assistant Examiner — Metasebia Retebo
(74) Attorney, Agent, or Firm — Oliff PLC

(57) ABSTRACT

An ECU controls drive signals output to relays. A current sensor detects current flowing between one of the relays and a power supply port. A connection circuit is configured to electrically connect a first section with a second section when only one of the drive signals is placed into an active state by the ECU. The first section is a portion of a first one of power lines between the current sensor and the power supply port. The second section is a portion of a second one of the power lines between the relay and the power supply port.

4 Claims, 7 Drawing Sheets

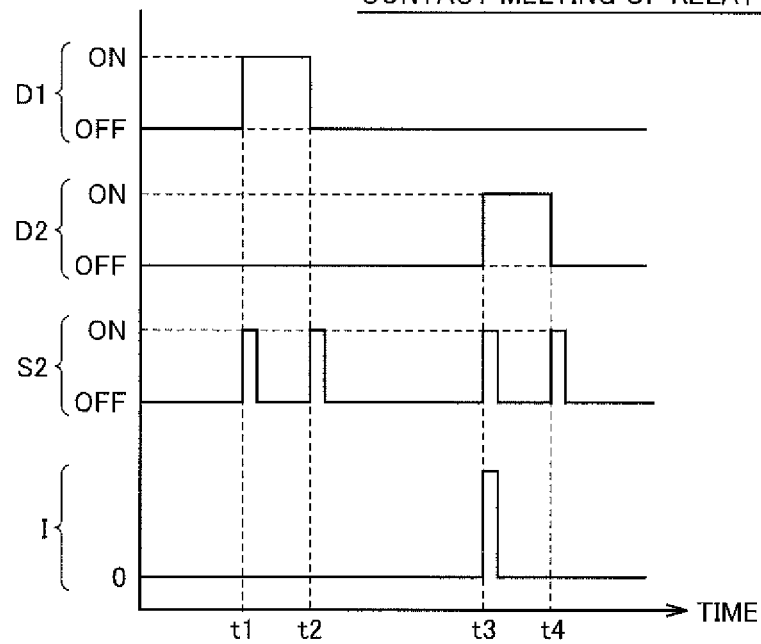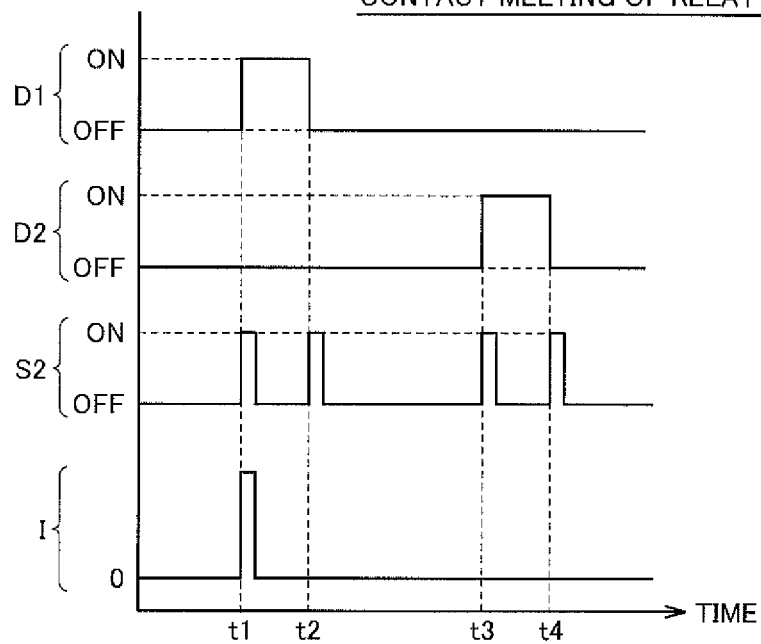

POWER SUPPLY APPARATUS AND VEHICLE INCLUDING THE SAME

This nonprovisional application is based on Japanese Patent Application No. 2015-028541 filed on Feb. 17, 2015 with the Japan Patent Office, the entire contents of which are hereby incorporated by reference.

BACKGROUND

Technical Field

The present disclosure relates to a power supply apparatus and a vehicle including the same, and more particularly to a power supply apparatus that supplies electric power from a DC (Direct Current) power source to the outside through a power supply port, and a vehicle including the same.

Description of Background Art

Japanese Patent Laid-Open No. 2014-204455 discloses a power supply system capable of supplying electric power from a power storage device installed on a vehicle to electric equipment connected to an outlet (power supply port) of the vehicle. A relay is provided on a power line connected to the outlet. A current sensor for detecting current supplied from the outlet to the electric equipment is provided between the relay and the outlet.

As for the relay as described above, a contact melting diagnosis of the relay is conducted in order to check whether the relay adheres (becomes stuck) in a closed state (will not move from the closed state). The contact melting diagnosis is conducted by detecting the voltage between a power line pair between the relay and an external terminal such as the outlet with a voltage sensor when one of a pair of relays provided on the power line pair is turned on and the other is turned off.

In the power supply system as described above, a current sensor for detecting current output to the outside through the outlet may be provided between the relay and the outlet in order to detect power supplied to electric equipment. In such a case, the voltage sensor for detecting the voltage between the power line pair between the relay and the external terminal such as the outlet may be used to check whether the relay adheres in a closed state. However, the provision of the voltage sensor as well as the current sensor between the relay and the outlet increases the cost.

SUMMARY

The disclosed embodiments are made in order to address such a problem and aim to provide a power supply apparatus for supplying electric power from a DC power source to the outside through a power supply port, in which a determination as to whether a relay adheres in a closed state can be checked with a current sensor provided between the relay and the power supply port.

According to preferred embodiments, a power supply apparatus includes a DC power source, a power supply port, first and second power lines, first and second relays, an electronic control unit, a current sensor, and a connection circuit. The power supply port supplies electric power output from the DC power source to the outside. The first and second power lines are disposed between the DC power source and the power supply port. The first relay is provided on the first power line. The second relay is provided on the second power line. The electronic control unit controls a first drive signal output to the first relay and a second drive signal output to the second relay. The current sensor detects current flowing between the first relay and the power supply port. The connection circuit is configured to electrically connect a first section with a second section when only one of the first and second drive signals is placed into an active state by the electronic control unit. The first section is a portion of the first power line between the current sensor and the power supply port. The second section is a portion of the second power line between the second relay and the power supply port.

With the configuration as described above, for example, if the first relay suffers contact melting, current flows between the first and second power lines through the connection circuit when only the second drive signal is placed into the active state by the electronic control unit. This current is detected by the current sensor whereby the contact melting of the first relay can be detected. This power supply apparatus thus can carry out a contact melting diagnosis with the current sensor without the provision of a voltage sensor for a contact melting diagnosis of the relays.

Preferably, the electronic control unit determines that the second relay adheres in a closed state if current is detected by the current sensor when only the first drive signal is placed into the active state by the electronic control unit. The electronic control unit thus determines that the second relay adheres in a closed state if current is detected by the current sensor when the first drive signal is placed into the active state.

In this power supply apparatus, the presence/absence of adhesion in a closed state in each of the first and second relays can be determined with a detected value obtained by the current sensor.

Preferably, the connection circuit includes an operation circuit and a switch. The operation circuit outputs an exclusive OR of the first and second drive signals. The switch is provided between the first section of the first power line and the second section of the second power line for electrically connecting the first section with the second section when output of the operation circuit is in an active state.

In this power supply apparatus, when only one of the first and second drive signals is placed into the active state, the output of the operation circuit is placed into the active state so that the switch electrically connects the first section with the second section. Thus, if one of the relays which received a drive signal that is not in the active state suffers contact melting, current flows between the first and second power lines through the connection circuit. In this power supply apparatus, this current is detected with the current sensor whereby adhesion in a closed state of the relay can be detected.

Preferably, the connection circuit includes an operation circuit, a detection circuit, and a switch. The operation circuit outputs an exclusive OR of the first and second drive signals. The detection circuit detects a change of the output of the operation circuit. The switch is provided between the first section of the first power line and the second section of the second power line and electrically connects the first section with the second section when an output of the detection circuit is placed into the active state.

Further preferably, the detection circuit includes a differential circuit for performing a differential operation on the output of the operation circuit, and an absolute value circuit for performing an absolute value operation on an output of the differential circuit.

With such a configuration, even if one of the first drive signal and the second drive signal is short-circuited to the power supply (connected to the power supply) and thus cannot be placed into the inactive state, output of the detection circuit is activated when one of the drive signals that is not short-circuited is placed into the active state, and the switch electrically connects the first section with the second section. In this power supply apparatus, therefore, the presence/absence of adhesion in a closed state in each of the first and second relays can be detected even when one of the first drive signal and the second drive signal is short-circuited to the power supply to prevent that signal from being placed into the inactive state.

According to the present disclosure, a vehicle includes the power supply apparatus as described above.

In this vehicle, the current sensor provided between one of the relays and the power supply port can be used to check whether either of the relays adheres (is stuck) in a closed state.

The foregoing and other objects, features, aspects and advantages of the present disclosure will become more apparent from the following detailed description of preferred embodiments when taken in conjunction with the accompanying drawings.

BRIEF DESCRIPTION OF THE DRAWINGS

FIG. 10 is a diagram showing waveforms of signals and current during a relay contact melting diagnosis when relay 50 suffers contact melting in the second embodiment.

FIG. 11 is a diagram showing waveforms of signals and current during a relay contact melting diagnosis when relay 52 suffers contact melting in the second embodiment.

DESCRIPTION OF PREFERRED EMBODIMENTS

Preferred embodiments will be described in detail below with reference to the figures. In the figures the same or corresponding parts are denoted with the same reference signs and a description thereof will not be repeated.

First Embodiment

Figure 1:
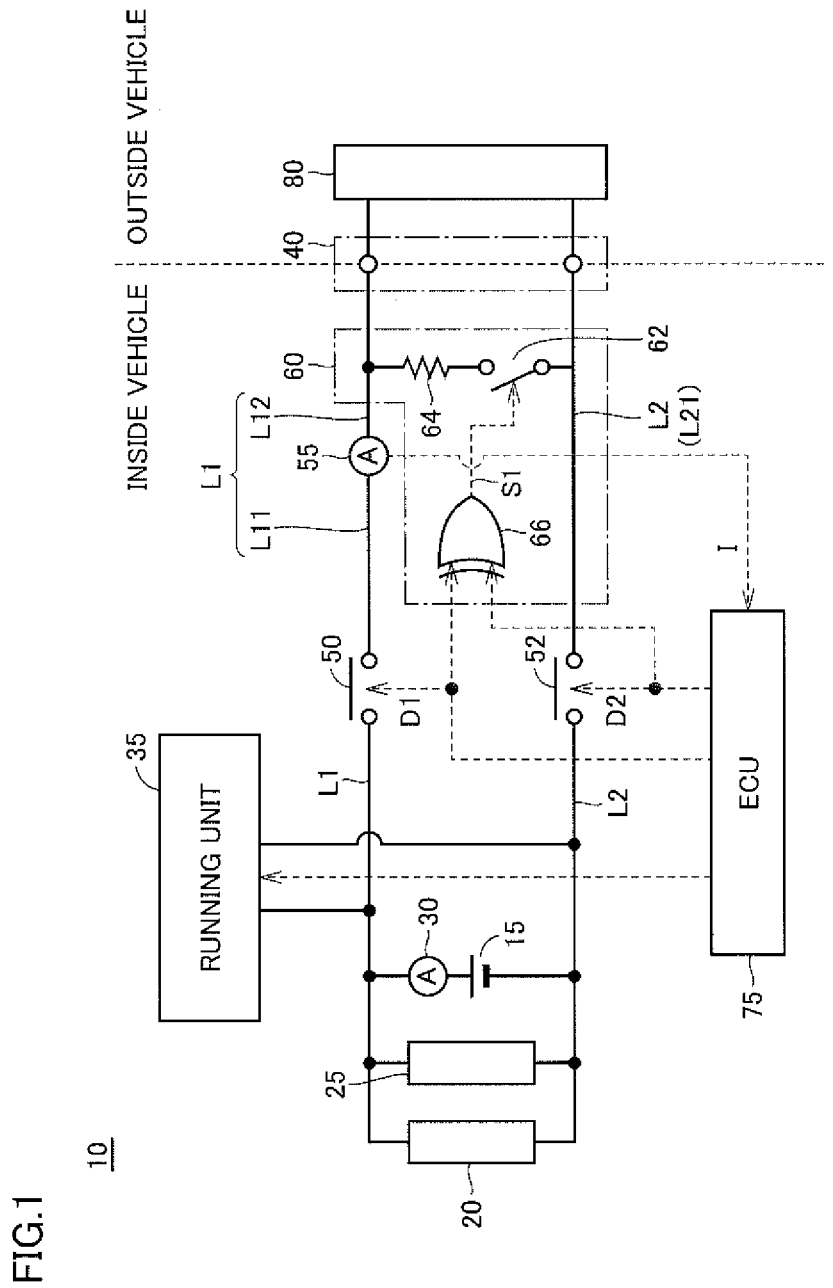
FIG. 1 is an overall configuration diagram of a vehicle to which a power supply apparatus according to a first embodiment is applied.

FIG. 1 is an overall configuration diagram of a vehicle to which a power supply apparatus according to a first embodiment is applied. Referring to FIG. 1, a vehicle 10 includes a power storage device 15, a fuel cell 20, an auxiliary system 25, a current sensor 30, and a running unit 35. Vehicle 10 further includes a power supply port 40, relays 50, 52, a current sensor 55, a connection circuit 60, and an ECU (Electronic Control Unit) 75.

Power storage device 15 and fuel cell 20 each are a DC (Direct Current) power source connected to power lines L1, L2. Power storage device 15 is configured to include a secondary battery such as a lithium ion battery or a nickel metal hydride battery, or a large-capacity electric double layer capacitor. Electric power stored in power storage device 15 can be supplied to running unit 35, auxiliary system 25, power supply port 40 and the like through power lines L1, L2. Power storage device 15 can store regenerative power generated in running unit 35, for example, during braking of vehicle 10. Current sensor 30 detects current input/output to/from power storage device 15.

Fuel cell 20 generates electric power through a chemical reaction of hydrogen and oxygen and is configured to include, for example, a solid polymer fuel cell. The type of the fuel cell is not limited thereto and a variety of known types can be employed. Electric power generated by fuel cell 20 can be supplied to running unit 35, auxiliary system 25, and power supply port 40 or can be stored in power storage device 15 through power lines L1, L2.

Auxiliary system 25 collectively refers to a variety of auxiliary equipment and an auxiliary equipment battery mounted on vehicle 10. Auxiliary system 25 is connected to power lines L1, L2 to be supplied with electric power from power storage device 15 or fuel cell 20. More specifically, auxiliary system 25 includes a DC/DC converter that lowers the voltage of DC power received from power storage device 15 or fuel cell 20 to an auxiliary equipment voltage level to be supplied to a variety of auxiliary equipment and the auxiliary equipment battery.

Running unit 35 generates driving force for driving the driving wheels (not shown) for running. Running unit 35 is also connected to power lines L1, L2 to be supplied with electric power from at least one of power storage device 15 and fuel cell 20. Though not shown, running unit 35 includes a converter and an inverter supplied with electric power from power storage device 15 or fuel cell 20, and a motor driven by the inverter to drive the driving wheels. Running unit 35 may include a generator that generates electric power for charging power storage device 15 and an engine capable of driving the generator as well as running the vehicle. That is, the vehicle can be an all-electric vehicle or a hybrid vehicle.

Power supply port 40 is an output terminal connected to power lines L1, L2 for supplying electric power output from at least one of power storage device 15 and fuel cell 20 to the outside of the vehicle. A feeder 80 provided outside the vehicle is electrically connected to power supply port 40, and electric power output from power supply port 40 is supplied to an electric load (not shown, hereinafter referred to as "external electric load") outside the vehicle through feeder 80. Power supply to an external electric load electrically connected to power supply port 40 through feeder 80 is hereinafter referred to as "external power supply".

Relays 50, 52 are provided on power lines L1, L2, respectively, disposed between DC power sources, which are power storage device 15 and fuel cell 20, and power supply port 40. When relays 50, 52 are on (in a conducting state), electric power can be supplied from at least one of power storage device 15 and fuel cell 20 to the external electric load through power supply port 40 and feeder 80. On the other hand, when external power supply is not performed, for example, during vehicle running, relays 50, 52 are controlled to be off (in a power cut-off state). Relays 50, 52 are driven by drive signals D1, D2, respectively, output from ECU 75.

Current sensor 55 is provided for detecting current output from power supply port 40 during external power supply. Although current sensor 30 is also provided for power storage device 15, current sensor 55 is provided in order to detect power (current) actually supplied from power supply port 40 to the external electric load because power is supplied from power storage device 15 to auxiliary system 25 and ECU 75 as well during external power supply. Specifically, current sensor 55 is provided between relay 50 and power supply port 40 on power line L1 and detects current I flowing through relays 50, 52 to output current I to ECU 75.

ECU 75 includes a CPU (Central Processing Unit), a memory, and an input/output buffer to perform a variety of control in vehicle 10. As a typical example, when external power supply is requested, ECU 75 executes a contact melting diagnosis of relays 50, 52 (detailed later). If it is determined that relays 50, 52 are normal, ECU 75 turns on both of relays 50 and 52 to execute external power supply. The contact melting diagnosis of relays 50, 52 may be executed when external power supply is finished. When the ignition key (or switch) is turned on and the activation of the running system including running unit 35 is requested, ECU 75 executes running control of vehicle 10.

Connection circuit 60 is provided in order to carry out a contact melting diagnosis of relays 50, 52 using a detected value by current sensor 55. Connection circuit 60 includes a switch 62, a limiting resistor 64, and an operation circuit 66.

Switch 62 and limiting resistor 64 are connected in series between a section (line L12) of power line L1 between current sensor 55 and power supply port 40, and a section (line L21) of power line L2 between relay 52 and power supply port 40. When a signal S1 output from operation circuit 66 is activated (placed in an "active" or "on" state), switch 62 is turned on (placed into a conducting state). When signal S1 is inactive (placed in an "inactive" or "off" state), switch 62 is turned off (placed into a cut-off state). Limiting resistor 64 is provided in order to prevent large current from flowing from power line L1 to power line L2 through switch 62. Section L11 of power line L1 is located between relay 50 and current sensor 55.

Operation circuit 66 receives drive signals D1, D2 for driving relays 50, 52, respectively. Operation circuit 66 then performs an exclusive OR operation of drive signals D1, D2 and outputs the operation result as signal S1 to switch 62. That is, operation circuit 66 activates signal S1 (places signal S1 in an "active" or "on" state) when one of drive signals D1, D2 is activated (placed in the "active" or "on" state), and inactivates signal S1 (places signal S1 in an "inactive" or "off" state) when both of drive signals D1, D2 are active (placed in an "active" or "on" state) or inactive (placed in an "inactive" or "off" state).

With such a configuration, connection circuit 60 electrically connects the section of line L12 of power line L1 with the section of line L21 of power line L2 in response to switch 62 being turned on (placed into a conducting state) when only one of drive signals D1, D2 is activated.

The provision of connection circuit 60 allows ECU 75 to execute a contact melting diagnosis of relays 50, 52 based on current I detected by current sensor 55. The contact melting diagnosis of relays 50, 52 executed in the power supply apparatus according to the present first embodiment will be described below.

For a relay contact melting diagnosis, in a vehicle in which the power storage device mounted on the vehicle is charged with electric power supplied from a power source external to the vehicle through a power receiving port, a voltage sensor for a contact melting diagnosis is generally provided between a pair of relays provided on a power line pair for charging and the power receiving port. If the voltage sensor detects a voltage when only one of the pair of relays is turned on, it is determined that the relay that is off suffers contact melting.

Vehicle 10 in the present first embodiment is configured to be capable of external power supply and includes current sensor 55 for detecting power (current) actually supplied from power supply port 40 to the external electric load. The provision of a voltage sensor for a contact melting diagnosis in addition to this current sensor 55 increases the cost. In the power supply apparatus according to the present first embodiment, therefore, a contact melting diagnosis of relays 50, 52 is performed using current sensor 55 without the additional provision of a voltage sensor for a contact melting diagnosis of relays 50, 52.

In order to enable a contact melting diagnosis of relays 50, 52 using current sensor 55, connection circuit 60 described above is provided in the power supply apparatus according to the present first embodiment. In a contact melting diagnosis of relays 50, 52, only one of drive signals D1, D2 is activated to turn on only one of relays 50, 52 (place the relay into a conducting state). When only one of drive signals D1, D2 is activated to turn on switch 62 (place the switch 62 into a conducting state), connection circuit 60 electrically connects the section of line L12 of power line L1 with the section of line L21 of power line L2. In this case, if current sensor 55 detects non-zero current I, ECU 75 determines that current flows through connection circuit 60 because the relay that is off (one of the relays in which the drive signal is not activated) is conducting, and determines that the relay that is off suffers contact melting.

Figure 2:
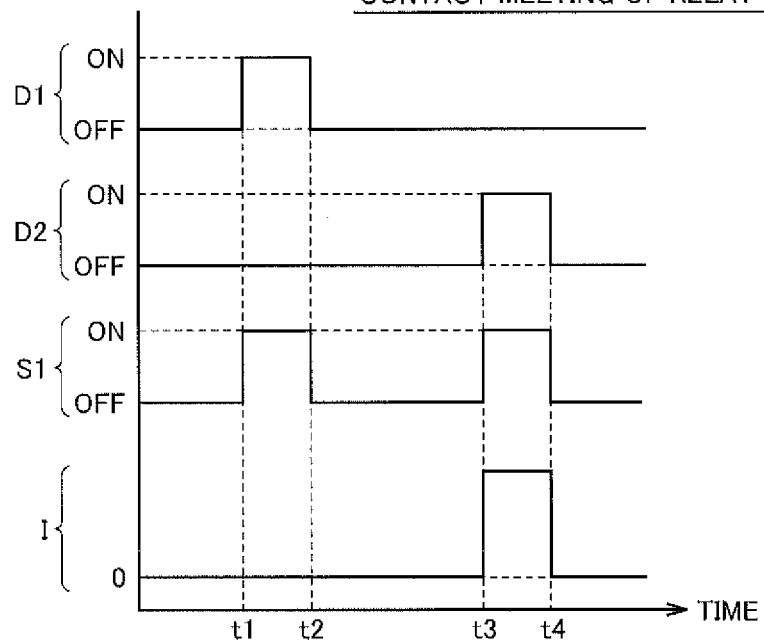
FIG. 2 is a diagram showing waveforms of signals and current during a relay contact melting diagnosis when relay 50 suffers contact melting.
Figure 3:
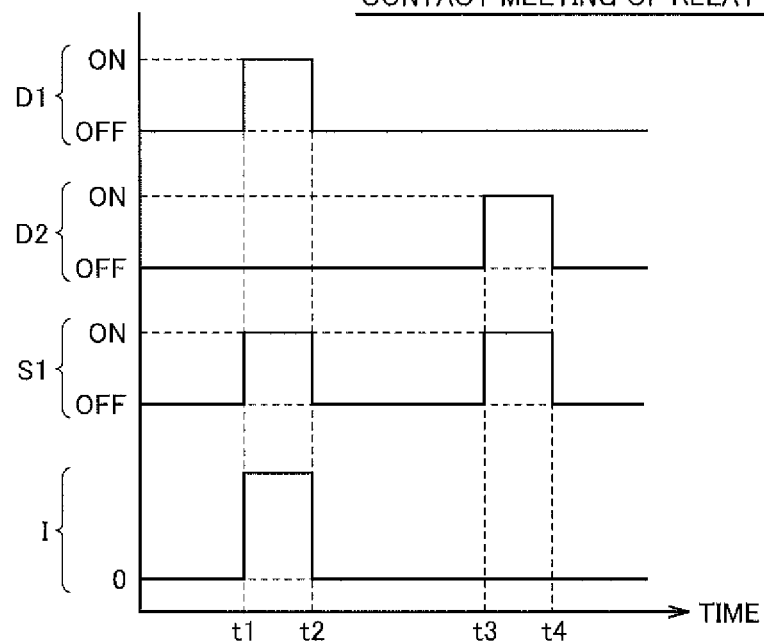
FIG. 3 is a diagram showing waveforms of signals and current during a relay contact melting diagnosis when relay 52 suffers contact melting.

FIG. 2 is a diagram showing waveforms of signals and current during a relay contact melting diagnosis when relay 50 suffers contact melting. FIG. 3 is a diagram showing waveforms of signals and current during a relay contact melting diagnosis when relay 52 suffers contact melting.

Referring to FIG. 2 together with FIG. 1, at time t1, drive signal D1 for driving relay 50 is activated (drive signal D2 for driving relay 52 is inactive). Signal S1 is then activated in connection circuit 60 to turn on switch 62 (place switch 62 into a conducting state). However, since relay 52 is turned off (relay 52 is in a power cut-off state) by the inactive drive signal D2, current does not flow through connection circuit 60, and current I detected by current sensor 55 is zero. ECU 75 therefore determines that relay 52 is normal.

At time t2, drive signal D1 is inactivated (signal S1 is also inactivated). At time t3, drive signal D2 is activated (drive signal D1 is inactive). Signal S1 is then activated again in connection circuit 60 to turn on switch 62 (place switch 62 into a conducting state). At this point of time, although drive signal D1 is inactive, current flows through connection circuit 60 because relay 50 suffers contact melting, and current I detected by current sensor 55 is not zero. ECU 75 therefore determines that relay 50 suffers contact melting.

Referring to FIG. 3 together with FIG. 1, if relay 52 suffers contact melting, at time t1, when drive signal D1 is activated, current flows through connection circuit 60, and current I detected by current sensor 55 is not zero. ECU 75 therefore determines that relay 52 suffers contact melting.

At time t3, when drive signal D2 is activated, signal S1 is activated, but relay 50 is turned off (relay 50 is in a power cut-off state) in accordance with the inactive drive signal D1. Current thus does not flow through connection circuit 60, and current I detected by current sensor 55 is zero. ECU 75 therefore determines that relay 50 is normal.

Figure 4:
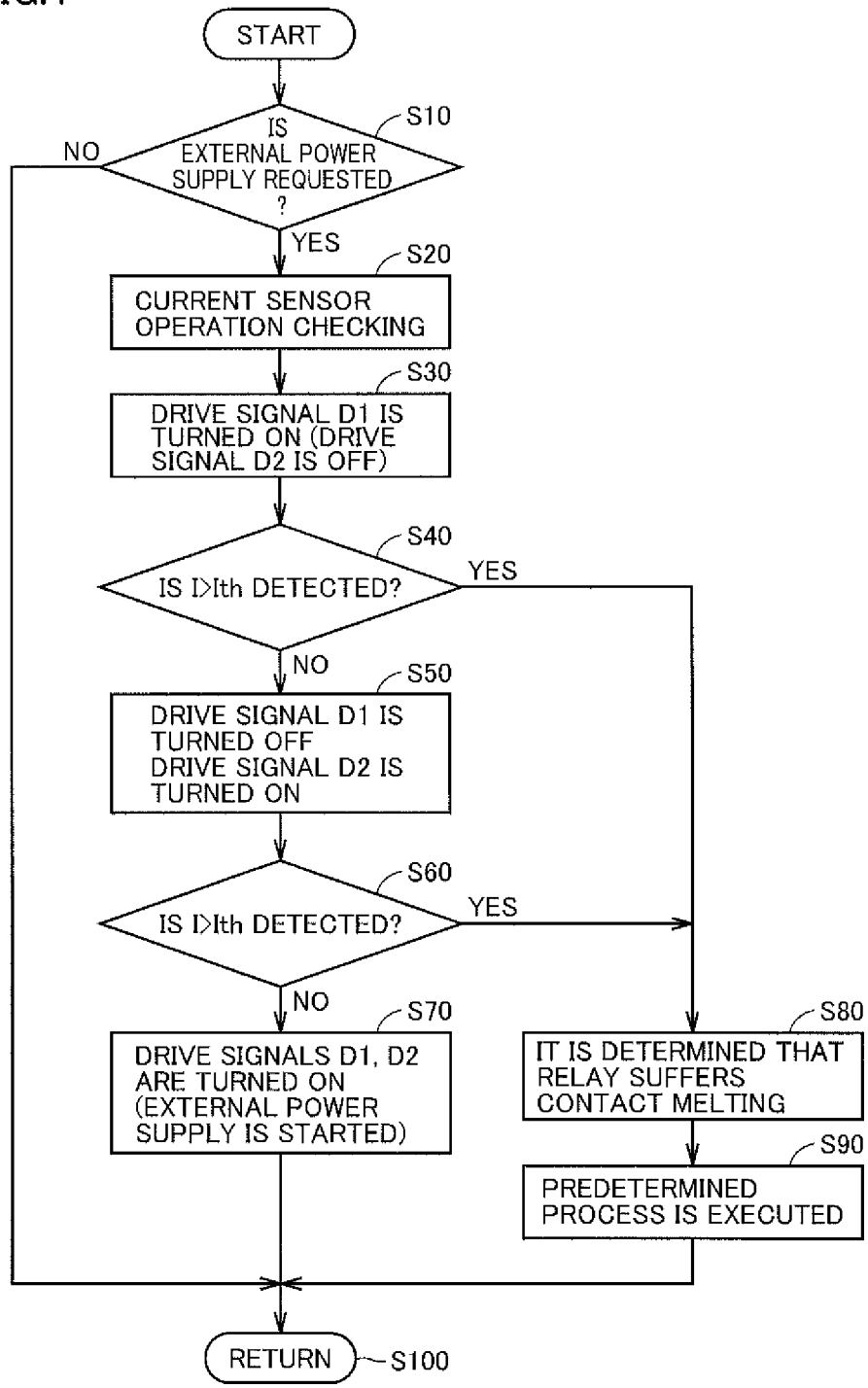
FIG. 4 is a flowchart showing the process procedure of a relay contact melting diagnosis executed by an ECU shown in FIG. 1.

FIG. 4 is a flowchart showing the process procedure of a contact melting diagnosis of relays 50, 52 executed by ECU 75 shown in FIG. 1. Referring to FIG. 4, ECU 75 determines whether external power supply is requested (step S10). For example, if an input device for requesting external power supply is operated by the user, or if connection of feeder 80 to power supply port 40 or connection of an external electric load to feeder 80 connected to power supply port 40 is detected, it can be determined that external power supply is requested. When external power supply is not requested (NO in step S10), ECU 75 moves to the process in step S100 without executing a series of subsequent processing.

If it is determined that external power supply is requested in step S10 (YES in step S10), ECU 75 executes an operation checking of current sensor 55 (step S20). For example, at this stage when both relays 50, 52 are turned off, the detected value of current I by current sensor 55 should be zero, but if the detected value indicates non-zero, calibration is performed to set the detected value to zero.

ECU 75 then turns on (activates) drive signal D1 (step S30). It is noted that drive signal D2 is off (inactive). ECU 75 then determines whether current I detected by current sensor 55 is equal to or greater than a predetermined threshold Ith that is not zero (step S40). This threshold Ith is a determination value for determining whether current flows through connection circuit 60, and is set appropriately, for example, based on the magnitude of limiting resistor 64.

If it is determined that current I is greater than threshold Ith in step S40 (YES in step S40), ECU 75 determines that the relay suffers contact melting (step S80). Specifically, if the determination is YES in step S40, ECU 75 determines that relay 52 suffers contact melting. ECU 75 then executes a predetermined process in the case where relay contact melting is detected (step S90).

In this predetermined process, a variety of processes can be executed. For example, ECU 75 may inactivate drive signals D1, D2 to prohibit external power supply or may activate drive signals D1, D2 to execute external power supply while outputting an alarm indicating that contact melting of the relay is detected. In the latter case, external power supply is not stopped immediately upon the detection of contact melting of the relay and external power supply is enabled while outputting an alarm, because external power supply may be executed in an emergency.

In step S40, if it is determined that current I is equal to or smaller than threshold Ith (NO in step S40), ECU 75 turns off (inactivates) drive signal D1 and turns on (activates) drive signal D2 (step S50). ECU 75 then determines whether current I detected by current sensor 55 is equal to or greater than threshold Ith (step S60).

If it is determined that current I is greater than threshold Ith (YES in step S60), ECU 75 moves to the process in step S80 and determines that the relay suffers contact melting. Specifically, if the determination is YES in step S60, ECU 75 determines that relay 50 suffers contact melting.

If it is determined that current I is equal to or smaller than threshold Ith in step S60 (NO in step S60), ECU 75 turns on (activates) both of drive signals D1, D2 (step S70). Then, both relays 50 and 52 are turned on, and external power supply by at least one of power storage device 15 and fuel cell 20 is started.

When both of drive signals D1, D2 are turned on (activated), signal S1 is turned off (inactivated) to turn off switch 62 (place switch 62 into a cut-off state) in connection circuit 60, so that current does not flow through connection circuit 60.

As described above, according to the present first embodiment, connection circuit 60 is provided so that a contact melting diagnosis of relays 50, 52 can be carried out using current sensor 55 without the additional provision of a voltage sensor for a contact melting diagnosis of relays 50, 52.

Second Embodiment

In the first embodiment, the adhesion in a closed state (that is the stuck-closed state) of relays 50, 52 cannot be detected when drive signals D1, D2 for driving relays 50, 52 are short-circuited to the power supply (connected to the power supply), which can occur when the relays become stuck and fail to turn off.

Figure 5:
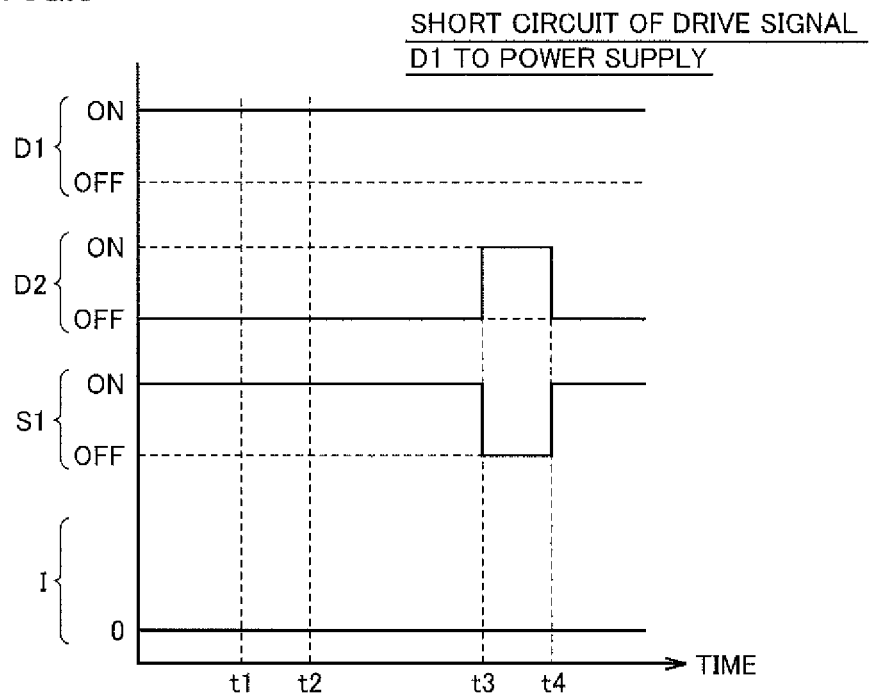
FIG. 5 is a diagram showing waveforms of signals and current during a relay contact melting diagnosis when a drive signal of relay 50 is short-circuited to the power supply in the configuration of the first embodiment.
Figure 6:
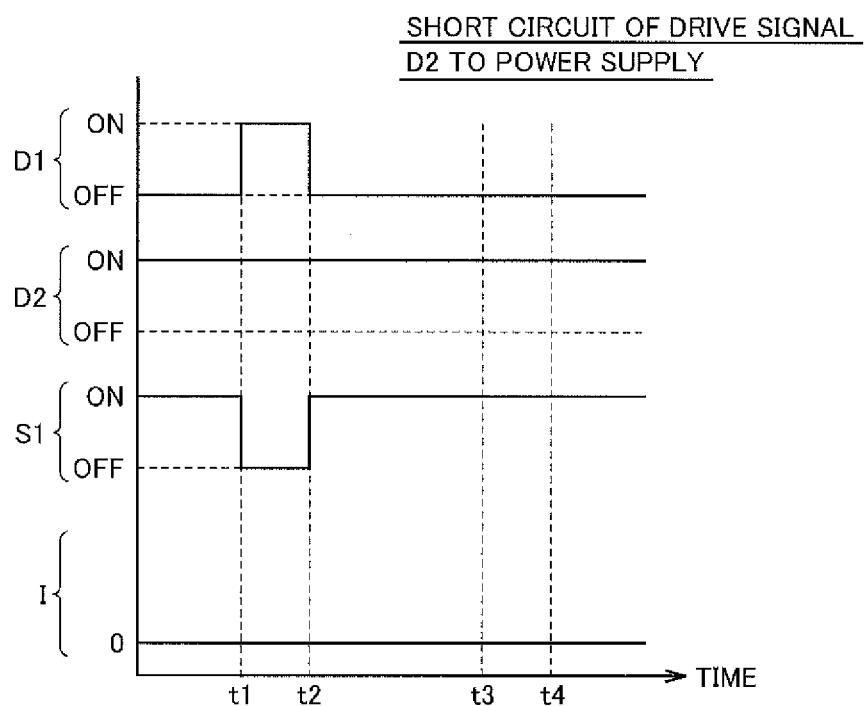
FIG. 6 is a diagram showing waveforms of signals and current during a relay contact melting diagnosis when a drive signal of relay 52 is short-circuited to the power supply in the configuration of the first embodiment.

FIG. 5 is a diagram showing waveforms of signals and current during a relay contact melting diagnosis when drive signal D1 of relay 50 is short-circuited to the power supply in the configuration of the first embodiment. FIG. 6 is a diagram showing waveforms of signals and current during a relay contact melting diagnosis when drive signal D2 of relay 52 is short-circuited to the power supply in the configuration of the first embodiment.

Referring to FIG. 5 together with FIG. 1, drive signal D1 for driving relay 50 is short-circuited to the power supply and is in a normally activated state (an on state). Time t1 is a timing when ECU 75 activates drive signal D1 (drive signal D2 is inactive). Since drive signal D1 is short-circuited to the power supply, signal S1 is activated while drive signal D2 is inactive, and switch 62 is turned on (a conducting state). However, since relay 52 is turned off (a power cut-off state) by the inactive drive signal D2, current does not flow through connection circuit 60, and current I detected by current sensor 55 is zero. ECU 75 therefore determines that relay 52 is normal.

At time t3, when drive signal D2 is activated, signal S1 is inactivated to turn off switch 62 (place switch 62 into a cut-off state) since drive signal D1 is short-circuited to the power supply and thus drive signal D1 remains in the active state. Current thus does not flow through connection circuit 60, and current I detected by current sensor 55 is zero. The configuration of the first embodiment is therefore unable to detect the adhesion in a closed state of relay 50 due to the short circuit of drive signal D1 to the power supply.

Referring to FIG. 6 together with FIG. 1, if drive signal D2 of relay 52 is short-circuited to the power supply, at time t1, when drive signal D1 is activated, signal S1 is inactivated to turn off switch 62 (place switch 62 into a cut-off state) because drive signal D2 remains in the active state. Current thus does not flow through connection circuit 60, and current I detected by current sensor 55 is zero. The configuration of the first embodiment is therefore unable to detect the adhesion in a closed state of relay 52, either, due to the short circuit of drive signal D2 to the power supply.

The configuration in the present second embodiment then enables detection as to whether adhesion in a closed state occurs in either relay 50 or 52 due to the short circuit of one of drive signals D1, D2 to the power supply and enables a contact melting diagnosis in the relay driven by the drive signal that is not short-circuited.

Figure 7:
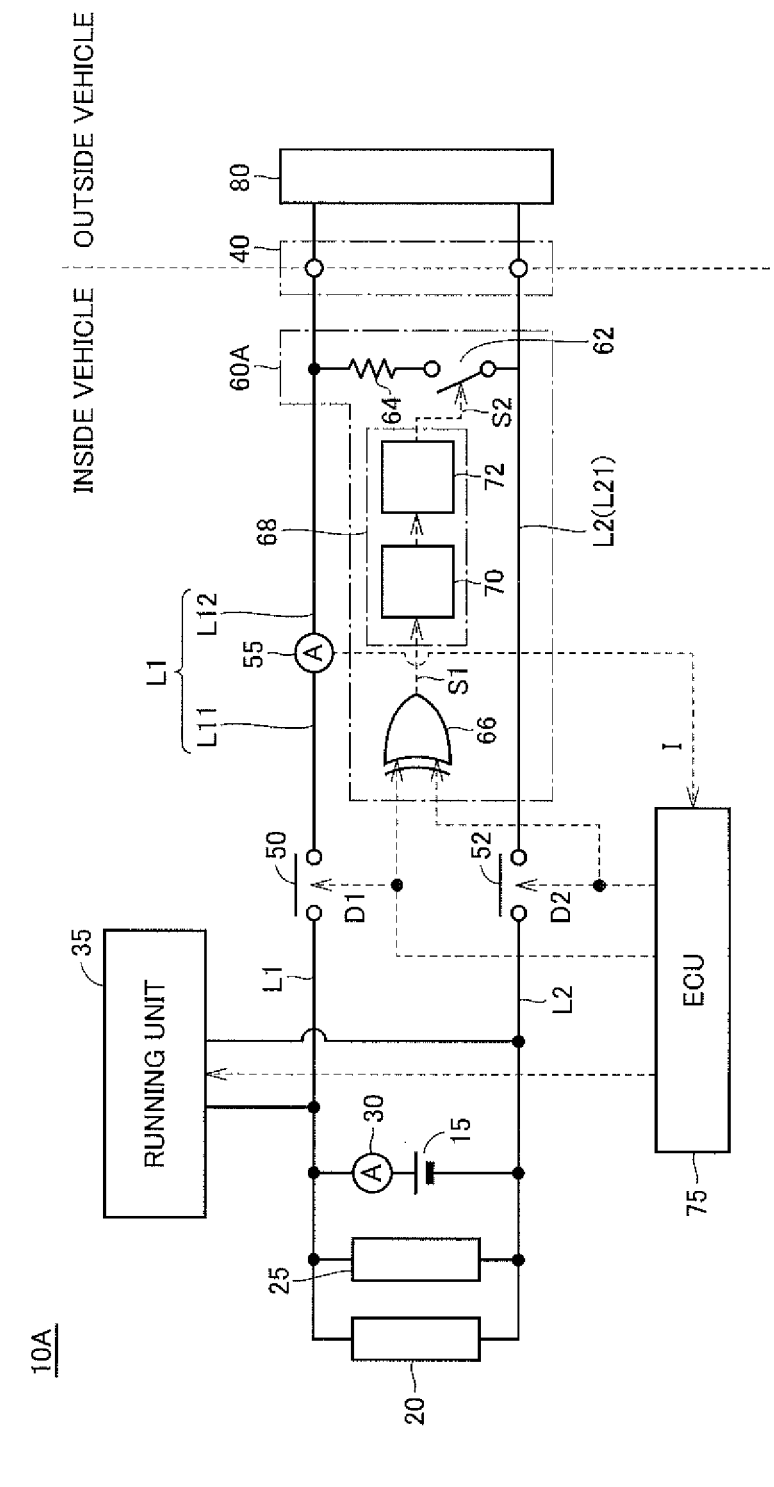
FIG. 7 is an overall configuration diagram of a vehicle to which a power supply apparatus according to a second embodiment is applied.

FIG. 7 is an overall configuration diagram of a vehicle to which a power supply apparatus according to the second embodiment is applied. Referring to FIG. 7, a vehicle 10A includes a connection circuit 60A in place of connection circuit 60 in the configuration of vehicle 10 shown in FIG. 1.

Connection circuit 60A further includes a detection circuit 68 in addition to the configuration of the connection circuit 60 shown in FIG. 1. Detection circuit 68 includes a differential circuit 70 and an absolute value circuit 72. Differential circuit 70 performs a differential operation on signal S1 output from operation circuit 66 that performs an exclusive OR operation of drive signals D1, D2. This differential circuit 70 detects a state change of signal S1 by performing a differential operation on signal S1.

Absolute value circuit 72 performs an absolute value operation on the output from differential circuit 70 and outputs the operation result as a signal S2 to switch 62. Differential circuit 70 outputs a signal with a sign corresponding to the direction of a state change of signal S1, and absolute value circuit 72 generates signal S2 not dependent on the direction of a state change of signal S1. As described above, detection circuit 68 including differential circuit 70 and absolute value circuit 72 is a circuit for detecting a state change of signal S1 irrespective of the direction of a state change of signal S1.

Switch 62 is turned on (placed into a conducting state) when signal S2 output from detection circuit 68 is activated, and is turned off (placed into a cut-off state) when signal S2 is inactive. With such a connection circuit 60A, the adhesion in a closed state of relays 50, 52 due to the short circuit of drive signals D1, D2 to the power supply can be detected. A function for appropriately holding signal S2 when signal S2 is activated may be provided because signal S2 may be a pulse-shaped signal.

Figure 8:
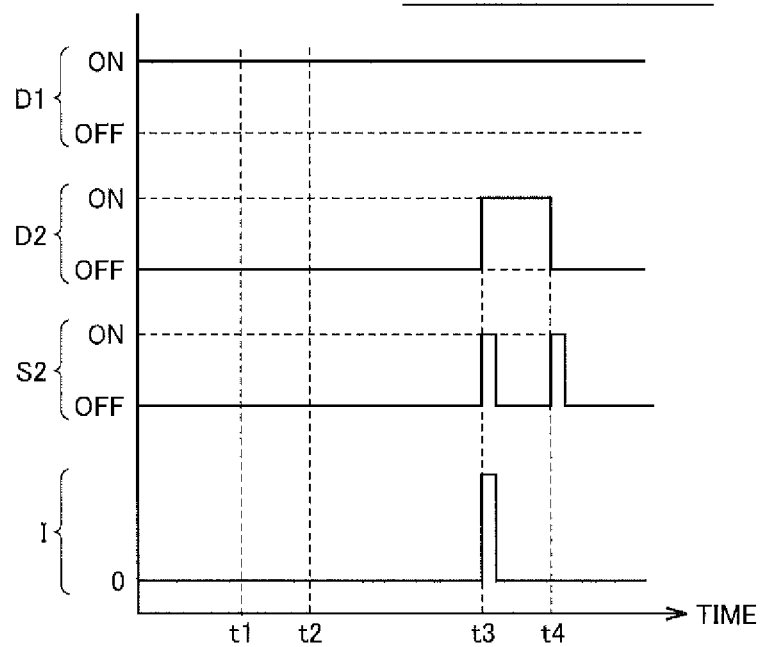
FIG. 8 is a diagram showing waveforms of signals and current during a relay contact melting diagnosis when a drive signal of relay 50 is short-circuited to the power supply in the second embodiment.
Figure 9:
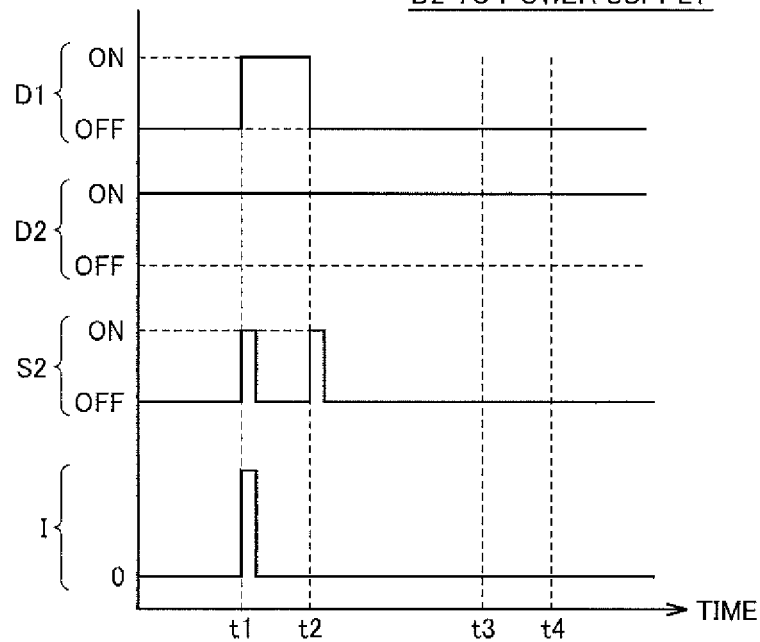
FIG. 9 is a diagram showing waveforms of signals and current during a relay contact melting diagnosis when a drive signal of relay 52 is short-circuited to the power supply in the second embodiment.

FIG. 8 is a diagram showing waveforms of signals and current during a relay contact melting diagnosis when drive signal D1 of relay 50 is short-circuited to the power supply in the second embodiment. FIG. 9 is a diagram showing waveforms of signals and current during a relay contact melting diagnosis when drive signal D2 of relay 52 is short-circuited to the power supply in the second embodiment.

Referring to FIG. 8 together with FIG. 7, drive signal D1 is short-circuited to the power supply and is in a normally activated state (an on state). Time t1 is a timing when ECU 75 activates drive signal D1 (drive signal D2 is inactive). Time t2 is a timing when ECU 75 inactivates drive signal D1. From time t1 to time t2, signal S2 output from detection circuit 68 is inactive, and current I detected by current sensor 55 is zero. ECU 75 therefore determines that relay 52 is normal.

At time t3, when drive signal D2 is activated, signal S2 is activated in accordance with a state change (active→inactive) of signal S1 output from operation circuit 66, so that switch 62 is turned on (placed into a conducting state). At this point of time, current flows through connection circuit 60A since relay 50 is on (placed into a conducting state) due to the short circuit of drive signal D1 to the power supply, and current I detected by current sensor 55 is not zero. ECU 75 therefore determines that relay 50 adheres in a closed state.

Also at time t4, when drive signal D2 is inactivated, signal S2 is activated in accordance with a state change of signal S1. However, current does not flow through connection circuit 60A since relay 52 is turned off at this timing (assume that relay 52 is normal).

Referring to FIG. 9 together with FIG. 7, if drive signal D2 is short-circuited to the power supply, when drive signal D1 is activated at time t1, signal S2 is activated in accordance with a state change (active→inactive) of signal S1 output from operation circuit 66, so that switch 62 is turned on (placed into a conducting state). At this point of time, current flows through connection circuit 60A since relay 52 is turned on (placed into a conducting state) due to the short circuit of drive signal D2 to the power supply, and current I detected by current sensor 55 is not zero. ECU 75 therefore determines that relay 52 adheres in a closed state.

Also at time t2, when drive signal D1 is inactivated, signal S2 is activated in accordance with a state change of signal S1. However, current does not flow through connection circuit 60A since relay 50 is turned off at this timing (assume that relay 50 is normal).

Time t3 is a timing when ECU 75 activates drive signal D2 (drive signal D1 is inactive). Time t4 is a timing when ECU 75 inactivates drive signal D2. From time t3 to time t4, signal S2 output from detection circuit 68 is inactive, and current I detected by current sensor 55 is zero. ECU 75 therefore determines that relay 50 is normal.

In the power supply apparatus according to the present second embodiment, the contact melting of relays 50, 52 not due to the short circuit of drive signals D1, D2 to the power supply can be detected as well.

FIG. 10 is a diagram showing waveforms of signals and current during a relay contact melting diagnosis when relay 50 suffers contact melting in the second embodiment. FIG. 11 is a diagram showing waveforms of signals and current during a relay contact melting diagnosis when relay 52 suffers contact melting in the second embodiment.

Referring to FIG. 10 together with FIG. 7, at time t1, drive signal D1 is activated (drive signal D2 is inactivated). Signal S2 is then activated in connection circuit 60A in accordance with a state change (inactive→active) of signal S1 output from operation circuit 66, so that switch 62 is turned on (placed into a conducting state). However, current does not flow through connection circuit 60A since relay 52 is turned off (relay 52 is in a power cut-off state) by the inactive drive signal D2, and current I detected by current sensor 55 is zero. ECU 75 therefore determines that relay 52 is normal.

At time t2, drive signal D1 is inactivated. At time t3, drive signal D2 is activated (drive signal D1 is inactive). Signal S2 is then activated in connection circuit 60A in accordance with a state change (inactive→active) of signal S1, so that switch 62 is turned on (placed into a conducting state). At this point of time, although drive signal D1 is inactive, current flows through connection circuit 60A since relay 50 suffers contact melting, and current I detected by current sensor 55 is not zero. ECU 75 therefore determines that relay 50 suffers contact melting.

Referring to FIG. 11 together with FIG. 7, if relay 52 suffers contact melting, at time t1, when drive signal D1 is activated, signal S2 is activated in connection circuit 60A in accordance with a state change (inactive→active) of signal S1 output from operation circuit 66, so that switch 62 is turned on (placed into a conducting state). Current thus flows through connection circuit 60A, and current I detected by current sensor 55 is not zero. ECU 75 therefore determines that relay 52 suffers contact melting.

The process procedure of a contact melting diagnosis of relays 50, 52 executed by ECU 75 in the present second embodiment is basically the same as the process procedure in the first embodiment shown in FIG. 4. In the present second embodiment, at step S80, not only the contact melting of the relay but also the adhesion in a closed state of the relay due to the short circuit of the drive signal to the power supply can be determined.

As described above, in the present second embodiment, connection circuit 60A is provided so that even when drive signal D1 or D2 is short-circuited to the power supply, one of the drive signals that is not short-circuited is activated to turn on switch 62 (place switch 62 into a conducting state). According to the second embodiment, therefore, the adhesion in a closed state of relays 50, 52 due to the short circuit of drive signals D1, D2 to the power supply can also be detected using current sensor 55.

Although fuel cell 20 is mounted as a DC power source on vehicles 10, 10A in the foregoing first and second embodiments, the embodiments also are applicable to a vehicle not provided with fuel cell 20. The embodiments also are applicable to a hybrid vehicle including an engine and a motor in running unit 35 and an electric vehicle not including an engine in running unit 35.

In the foregoing description, each of power storage device 15 and fuel cell 20 corresponds to an example of the "DC power source". Relays 50, 52 correspond to an example of the "first and second relays", and ECU 75 corresponds to an example of the "control unit".

Although the preferred embodiments have been described and illustrated in detail, it is clearly understood that these are examples only.

What is claimed is:

1. A power supply apparatus comprising:
a DC power source;
a power supply port configured to supply electric power output from the DC power source to an outside of the power supply apparatus;
first and second power lines disposed between the DC power source and the power supply port;
a first relay provided on the first power line;
a second relay provided on the second power line;
an electronic control unit configured to control a first drive signal output to the first relay and a second drive signal output to the second relay;
a current sensor configured to detect current flowing between the first relay and the power supply port; and
a connection circuit configured to electrically connect a first section with a second section when only one of the first and second drive signals is placed into an active state by the electronic control unit, the first section is a portion of the first power line between the current sensor and the power supply port, the second section is a portion of the second power line between the second relay and the power supply port, wherein the connection circuit includes
an operation circuit configured to output an exclusive OR of the first and second drive signals,
a detection circuit configured to detect a change of the output of the operation circuit, and
a switch provided between the first section and the second section and configured to electrically connect the first section with the second section when an output of the detection circuit is in the active state.

2. The power supply apparatus according to claim 1, wherein
the electronic control unit
determines that the second relay has become stuck in a closed state if current is detected by the current sensor when the first drive signal is placed into the active state while the second control signal is placed into an inactive state by the electronic control unit, and
determines that the first relay has become stuck in a closed state if current is detected by the current sensor when the second drive signal is placed into the active state while the first control signal is placed into the inactive state by the electronic control unit.

3. The power supply apparatus according to claim 1, wherein
the detection circuit includes
a differential circuit configured to perform a differential operation on the output of the operation circuit, and
an absolute value circuit configured to perform an absolute value operation on an output of the differential circuit.

4. A vehicle comprising the power supply apparatus according to claim 1.

\* \* \* \* \*